US007042568B2

(12) United States Patent
Mayo

(10) Patent No.: US 7,042,568 B2
(45) Date of Patent: May 9, 2006

(54) PRE-ALIGNER

(75) Inventor: Michael J. Mayo, Palo Alto, CA (US)

(73) Assignee: Asyst Technologies, Inc., Fremont, CA (US)

( * ) Notice: Subject to any disclaimer, the term of this patent is extended or adjusted under 35 U.S.C. 154(b) by 242 days.

(21) Appl. No.: 10/438,470

(22) Filed: May 15, 2003

(65) Prior Publication Data
US 2004/0043514 A1    Mar. 4, 2004

Related U.S. Application Data

(60) Provisional application No. 60/380,993, filed on May 16, 2002.

(51) Int. Cl.
  *G01B 11/00*    (2006.01)
(52) U.S. Cl. .................. 356/399; 250/559.29; 414/754
(58) Field of Classification Search ................ 356/399, 356/400, 139.07, 141.1; 414/754, 757, 816; 250/559.29, 559.3
See application file for complete search history.

(56) References Cited
U.S. PATENT DOCUMENTS 5,238,354 A     8/1993  Volovich
5,644,400 A     7/1997  Mundt
5,737,096 A     4/1998  Yakeuchi
5,740,034 A *   4/1998  Saeki ........................... 700/59
6,038,029 A *   3/2000  Finarov ....................... 356/399
6,162,008 A *  12/2000  Perkins et al. .............. 414/754
6,489,626 B1* 12/2002  van der Muehlen et al. ..... 250/559.29

FOREIGN PATENT DOCUMENTS

WO     WO 97 37376    10/1997

OTHER PUBLICATIONS

Patent Abstract of Japan, vol. 2002, No. 09, Sep. 4, 2002.

* cited by examiner

*Primary Examiner*—Layla G. Lauchman
(74) *Attorney, Agent, or Firm*—O'Melveny & Myers LLP

(57) ABSTRACT

The present invention is a pre-aligner capable of determining the center of a wafer by casting light onto a wafer that is positioned above a charge-coupled device (CCD). The pre-aligner performs this operation by directing light emitted from a single LED simultaneously onto the wafer and the CCD. The light emitted from the LED is directed through a light guide in order to direct the light onto the wafer and CCD. A lens collimates the light exiting the light guide such that the light, as it passes the wafer's edge, is substantially perpendicular to the wafer's edge. The light guide may be removably secured to the pre-aligner housing for easy installation removal. The pre-aligner is capable of self-calibrate the LED.

16 Claims, 9 Drawing Sheets

PRE-ALIGNER

CLAIM OF PRIORITY

This application claims priority to U.S. Provisional Patent Application Ser. No. 60/380,993, entitled "Pre-Aligner Light Source," filed with the U.S. Patent and Trademark Office on May, 16, 2002.

FIELD OF THE INVENTION

The present invention generally relates to a pre-aligner for centering a wafer prior to placing the wafer in a processing tool. More specifically, an embodiment of the present invention aligns a wafer by directing the light emitted from a single LED onto a charge coupled device (CCD) light array with a "light guide."

BACKGROUND OF THE INVENTION

In the semiconductor industry, it is common to pre-align a semiconductor wafer as part of readying the wafer for processing. The pre-alignment operation conventionally includes locating and precisely positioning the geometric center of the wafer. Once this operation is complete, the wafer is then placed in a selected orientation related to the orientation of its crystalline structure. This pre-alignment procedure is commonly completed as a separate operation before the wafer is transported to a processing apparatus for providing a desired finishing or processing step.

Conventionally, a robot removes the individual wafers, one at a time, from a transportation carrier and places them at the pre-alignment station. After the wafer is aligned, i.e., after the wafer is properly oriented and its geometric center is located, the wafer may be placed back into the transportation carrier or in a processing carrier in the pre-aligned condition.

It will be appreciated from the above that precise pre-alignment not only is desirable but can be a major factor in determining ultimate reliability of the integrated circuitry produced on a wafer. Many operations require very accurate alignment, and accurate pre-alignment reduces the mechanical and operational constraints in achieving such alignment.

FIG. 1 illustrates a conventional pre-aligner 10. This pre-aligner 10 includes a "light bar" as a light source. A light bar 12 typically consists of a row of multiple LED's 13. Using a light source which consists of multiple, individual LED's 13, has several disadvantages. For example, there is often a mismatched brightness between individual LED's 13. The mismatched brightness may cause a variation of the image intensity focused at the CCD 14. A non-uniform image intensity may cause a non-linear detection of the wafer's edge 16. Other problems may surface as the pre-aligner 10 ages. Specifically, the brightness of the individual LED's 13 will fade at different times. This fading will eventually lead to an uneven or non-uniform illumination. Accurate centering of the wafer requires even or uniform illumination. Therefore, a pre-aligner 10 using a conventional "light bar" 12 requires calibration in the factory which must be repeated every time the illumination becomes non-uniform. A diffuser 18 is commonly used to even out the distribution of light and minimize any effect stemming from the non-uniform illumination. The diffuser 18 is also used to control the total amount of light emitted by the array of LED's 13. Further, because the light emitted from the light bar 12 is uncollimated (contains light rays that are not parallel to each other), a camera lens 20 is commonly used to focus an image from the wafer 11 onto the CCD 14. Such a lens 20 is expensive.

Although a pre-aligner 10 using an array of LED's 13 as a light source commonly provides high accuracy, there are several disadvantages. By way of example only, it is necessary to perform intricate factory adjustments, tune the diffuser 18 to achieve uniform illumination from the multiple LED's 13. Additionally, since the light is uncollimated as it passes the wafer edge 16, the pre-aligner 10 is very sensitive to vertical runout of the wafer 11. Because of the non-vertical light, vertical runout of the spindle, which moves the wafer edge 16 up and down, also moves the shadow along the CCD 14. This up and down movement is indistinguishable from the shadow movement caused by horizontal wafer movement, which is the variable being measured.

In addition to electrical disadvantages, there are also mechanical limitations to the pre-aligner 10. The lighting assembly is vulnerable to damage. The light bar 12 mounts in a housing 18, which is suspended above the body 22 of the pre-aligner 10. Thus, the housing can be easily bent during shipping and handling, or by a collision with a robot arm. Additionally, because the light bar 12 is mounted above the CCD 14, electrical wiring must be routed out of the main body 22 of the pre-aligner 10 and up into the optical housing 18.

Some conventional pre-aligners, such as the pre-aligner 50 shown in FIG. 2, use light emitted from a single LED 52 to cast a shadow of the wafer edge 54 directly onto a CCD 56. Using a single LED 52 mounted above the wafer 51 (i.e., to a printed circuit board 58) and the CCD 56 has several disadvantages. For example, the pre-aligner 50 is very sensitive to vertical mount of the wafer 51. Similar to the light housing 12 shown in FIG. 1, the light emitted from the single LED 52 as it passes the wafer edge 54 is uncollimated. Thus, movement of the wafer up and down between the LED 52 and the CCD 56 moves the shadow casted onto the CCD 56.

Using light from a single source also has a magnification effect. As a result of the non-vertical light emitted from the LED 52, the movement of the shadow cast onto the CCD 56 is greater than the movement of the actual wafer edge 54. This exacerbation effect must be compensated for by added complexity in the software that determines the location of the center of the wafer.

The single LED 52 is also an inefficient use of light energy. Light emitted from the LED 52 fans out to a circular pattern by the time the light reaches the CCD 56. Thus, a majority of the light actually falls directly on the CCD 56 and not the wafer 51. Thus, the LED 52 must be closely located above the CCD 56 to provide adequate illumination. However, a LED 52 that is closely positioned to the wafer causes a spread of the shadow of the wafer edge 54 on the CCD 56. This effect is greatly exaggerated in FIG. 2 for illustration purposes. The "spread shadow" effect increases the uncertainty in determining the actual radius of the wafer edge 54 from the center of the spindle (not shown). As shown in FIG. 2, erroneously, the CCD 56 will measure the wafer edge 54 by a distance d. Further, as the LED 52 ages and its brightness diminishes, the sensitivity of the pre-aligner 50 will change over time.

Another conventional pre-aligner, such as pre-aligner 80 shown in FIG. 3, uses a laser diode 82 as a light source. A pre-aligner, which uses a laser diode 82 as a light source, has several advantages. With a single light source there is no possibility of a non-uniform light source. In the case of using a laser diode 82 as a light source, the laser circuit produces the same light output throughout the life of the product. Thus, no calibration is necessary to maintain an even or uniform light source. Additionally, because the light passing the wafer edge 84 is vertical, vertical runout of the spindle, which makes the wafer edge 84 move up and down, does not move the shadow along the CCD 86 in response to this runout. Thus, measurements of the movement of the shadow are more accurate. In addition, the vertical light path makes the shadow on the CCD 86 move exactly the same distance as the wafer edge 84.

In operation, light from the laser diode 82 naturally fans out in a circular pattern. The cylindrical lens 88 focuses the light into a narrow stripe by allowing the light to continue to diverge along the long axis of the CCD 86, greatly reducing the divergence of the light rays perpendicular to the long axis of the CCD 86. The light then encounters the two spherical lenses 90*a* and 90*b*, which are intended to refract the light to follow a vertical path past the wafer 81 and onto the CCD 56.

However, there are several disadvantages of a laser diode pre-aligner system similar to the pre-aligner 80. For example, the coherent nature of laser light results in speckles, or dark and light spots, on the CCD 86. These dark spots cause added uncertainty in the location of the shadow edge. Additionally, the laser diode 82 and associated regulating electronics are relatively expensive. Further, the narrow angle of light spread from the laser diode 82 requires that the light housing 92 be substantially taller than other optical systems (e.g., LED's). Similar to the previously mentioned pre-aligners, the laser diode 82 is mounted above the CCD 86 and therefore, electrical wiring must be routed out of the main body 94 of the pre-aligner 80 and up into the optical housing 92.

Accordingly, there is a need for a pre-aligner utilizing an LED as a light source, yet having the accuracy of a laser diode system. The present invention provides such a system.

SUMMARY OF THE INVENTION

One aspect of the present invention is to provide a pre-aligner that utilized light emitted from a single LED as its primary light source. As a light source that comprises a single LED reduces or eliminates the possibility of producing an uneven or non-uniform array of light.

It is another aspect of the present invention to provide a pre-aligner that may self-adjust the light source once the pre-aligner is installed. In one embodiment, the pre-aligner includes an LED brightness calibration function to maximize the energy efficiency of the LED. This calibration process may be performed upon startup of the pre-aligner or during routine intervals.

Yet another aspect of the present invention is to provide a pre-aligner that incorporates a "light guide" assembly that directs the light emitted from the LED simultaneously partially onto a wafer edge and a sensor. In a preferred embodiment, the light guide directs the light onto a wafer, that extends over the sensor the wafer casts a shadow onto the sensor, which can determine the radial turnout of the wafer based upon the amount of light that strikes the sensor.

A further aspect of the present invention is to provide a light guide assembly that may be produced inexpensively. In one embodiment, the light guide housing is manufactured from plastic. In another embodiment, the light guide may be easily removed and replaced.

Still another aspect of the present invention is to provide a pre-aligner whereby little or no recalibration of the LED is required after the light guide assembly has been removed and replaced. In one embodiment, the LED is held in place by a magnet that centers itself within the light guide housing. Thus, the light guide assembly may be removed from the pre-aligner during shipment, allowing a simpler, more compact packaging for shipment, which may be better protected in shipping.

Yet another aspect of the present invention is to provide a pre-aligner with a simplified electrical system. In one embodiment, the LED and the CCD are electrically connected to the same printed circuit board (PCB). By doing so, the separate cables and PCB conventionally associated and dedicated to the LED may be eliminated.

BRIEF DESCRIPTION OF THE DRAWINGS

FIG. 4A is a representative drawing of an embodiment of the pre-aligner, according to the present invention; FIG. 4B is a cross-sectional view of the pre-aligner shown in FIG. 4A, along view line A—A;

FIG. 5 is a representative drawing of another embodiment of the pre-aligner, according to the present invention; and FIG. 5B is a cross-sectional view of the pre-aligner shown in FIG. 5A, oblong view line A—A;

DETAILED DESCRIPTION OF THE INVENTION

Figure 8:
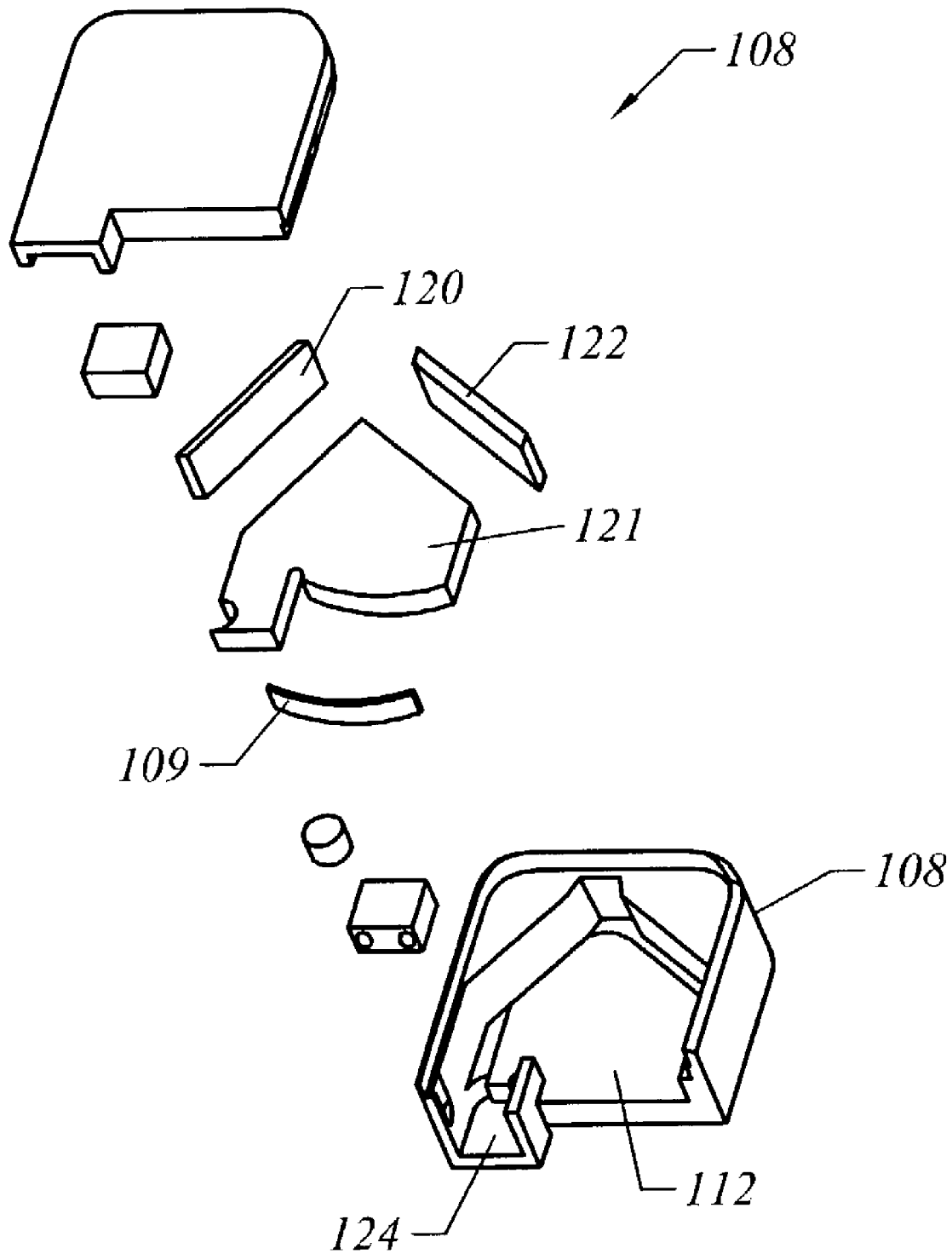
FIG. 8 is an assembly view of an embodiment of the light guide assembly, according to the present invention.
Figure 9:
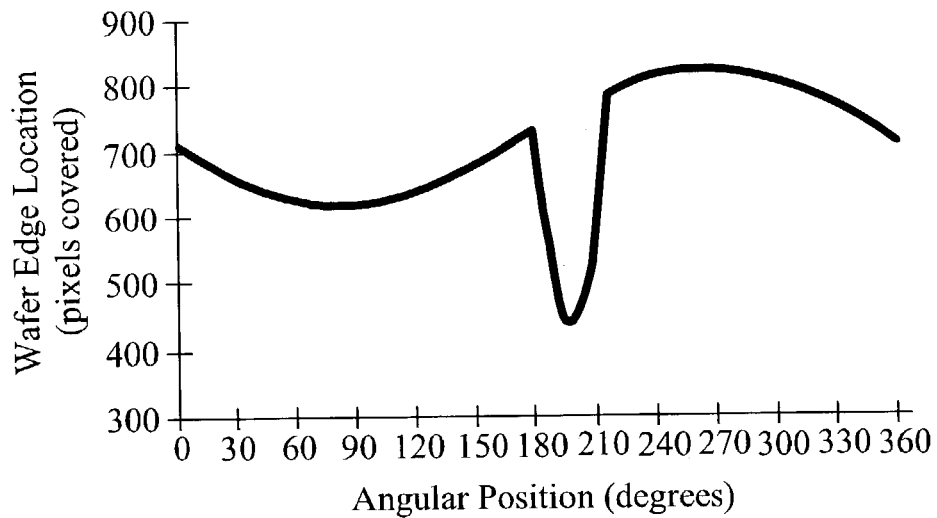
FIG. 9 is a graphical representation of the voltage input of the CCD during one revolution of the workpiece.
Figure 10:
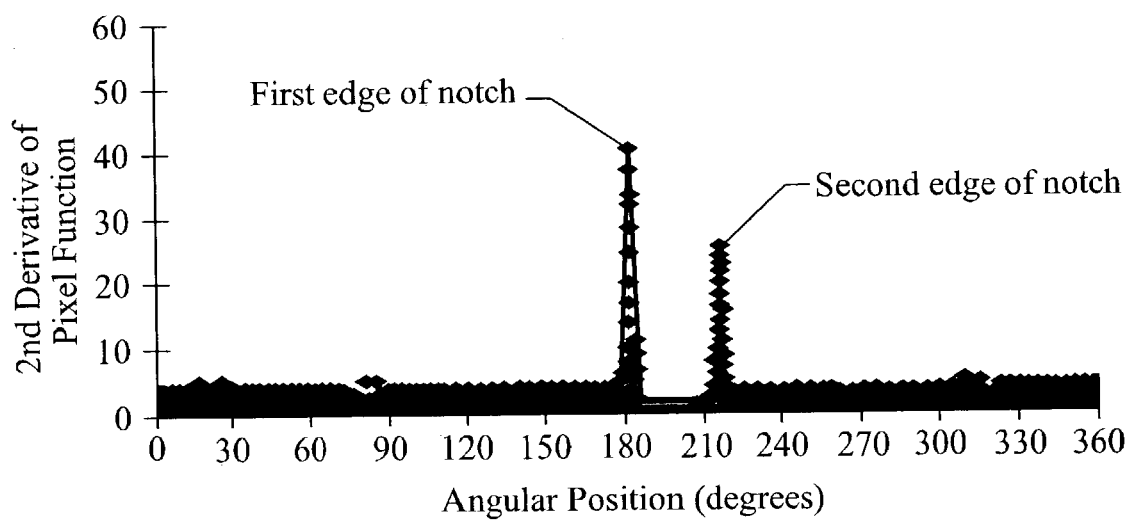
FIG. 10 is a graphical representation of the data shown in FIG. 9.

The present invention, and all the embodiments, will now be described with reference to FIGS. 8–10. In a preferred embodiment, the pre-aligner 100 uses the method of casting a shadow of a wafer edge directly onto a charge coupled device (CCD) linear array.

Figure 4A:
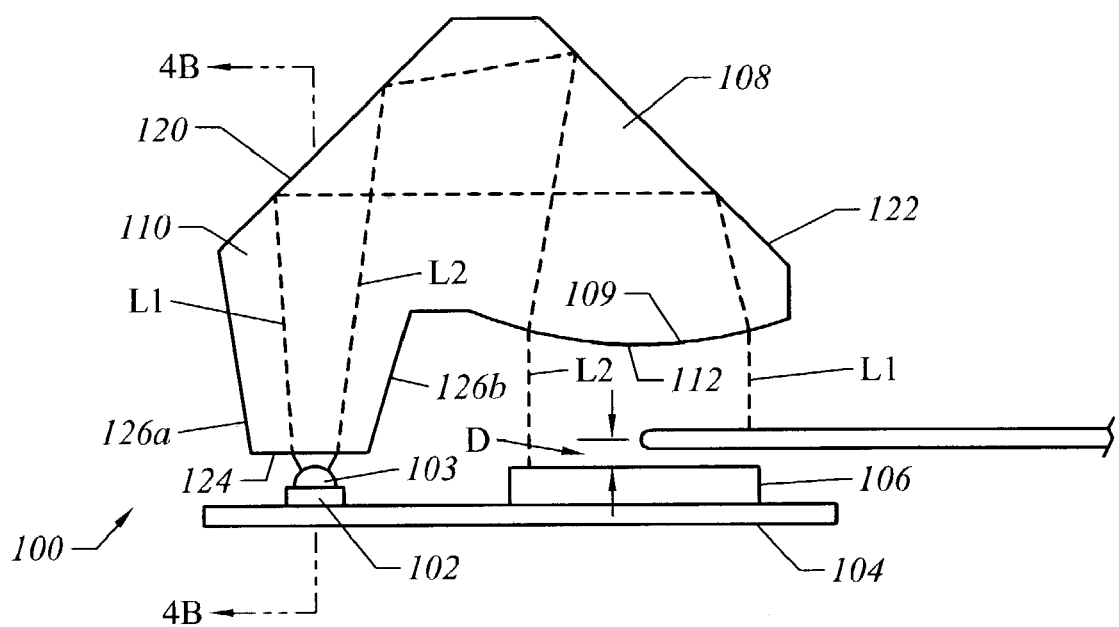
FIGS. 4A–4B.
Figure 4B:
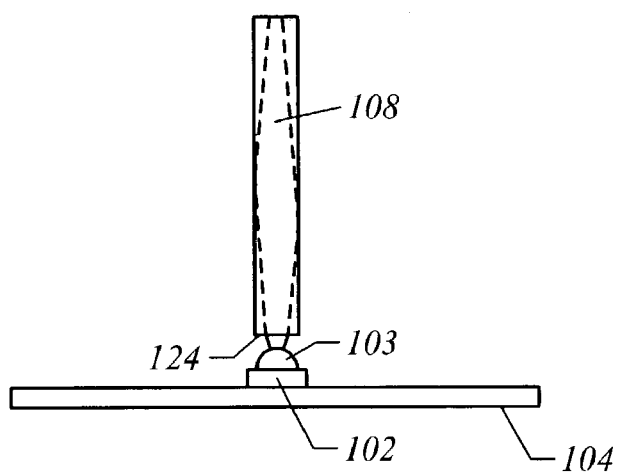

As shown in FIGS. 4A–4B, the pre-aligner 100 comprises an LED 102, a PCB 104, a CCD 106, and a light guide 108. An LED 102 is commonly known within to one skilled in the art and does not require further disclosure. The LED 102 is preferably the primary light source for the pre-aligner 100. In a preferred embodiment, a single LED 102 is the only light source for the pre-aligner 100. It is within the scope and spirit of the invention for the pre-aligner 100 to use more than one LED 102. As shown in FIG. 4A, the LED 102 has a light emitting portion 103. The LED 102 is mounted to the PCB 104 such that the light-emitting portion 103 is facing upward—toward the light guide 108.

As previously discussed above, the LED and CCD in a conventional aligner must be mounted opposite, or facing, each other so the light emitted from the LED will shine onto the CCD. To significantly reduce or eliminate the wiring conventionally associated with a pre-aligner device, the LED 102 and the CCD 106 are mounted on the same PCB 104. It is possible to mount the LED 102 and CCD 106 on the same circuit board 104 since the light emitted from the LED 102 is reflected back towards the wafer by a light guide 108. Thus, the LED 102 does not have to directly face the CCD 106. The CCD 106 is known to one skilled in the art and does not require further disclosure. The light guide 108 is preferably made from optical grade clear acrylic sheet. It is within the scope and spirit of the invention to manufacture the light guide 108 from other material.

In general, the light guide 108 defines an enclosed reflective enclosure that includes an inlet 114 and an outlet 112. When the pre-aligner 100 is assembled, the inlet 114 of the light guide 108 is preferably located substantially above the LED 102 while the outlet 112 of the light guide 108 is preferably positioned substantially over the CCD 106. The reflective enclosure preferably includes a light pipe portion 110, a first mirrored surface 20, a second mirrored surface 122, and a lens 112. In a preferred embodiment, the inlet 114 is comprised of the light pipe portion 110 and includes an entry window 124 positioned directly above the light-emitting portion 103 of the LED 102.

Figure 5A:
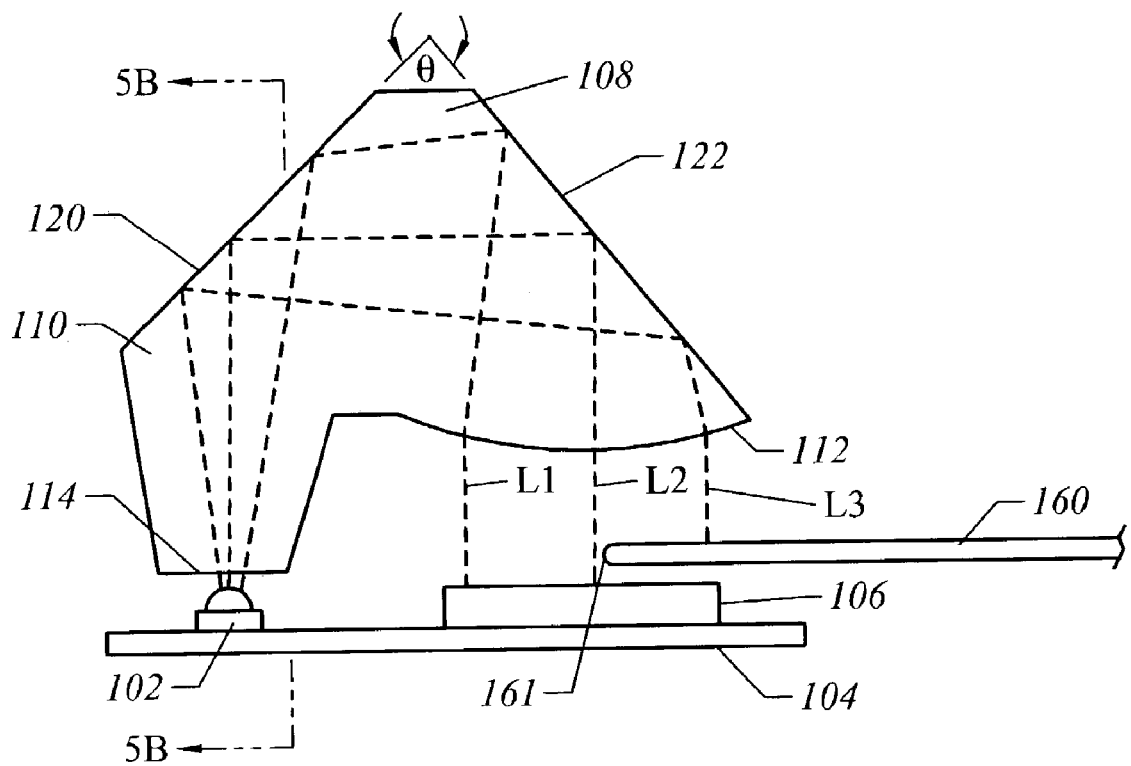
FIGS. 5A–5B.
Figure 5B:
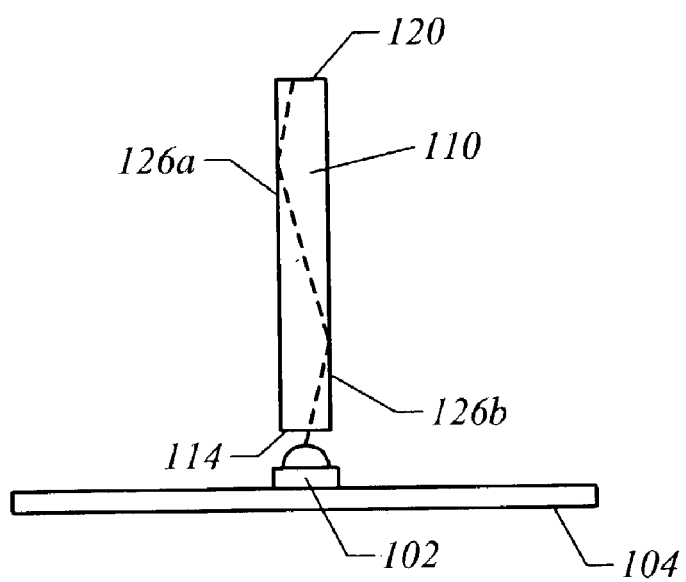

The light emitted from the LED 102 passes through the entry window 124 and enters the light pipe 110. As shown in FIG. 4B, the light emitted from the LED 102 is repeatedly reflected within the light pipe 110 as it travels upward towards the first mirrored surface 20. In optics, this is know an total internal reflection. The first mirrored surface 20 is located above the light pipe 110 and the LED 102. The location of the first mirrored surface 20 allows substantially all of the light reflected within the light pipe 110 to strike the first mirrored surface 20. The first mirrored surface 20 is preferably placed at a 45° angle with respect to the longitudinal axis of the light pipe 110. As shown in FIGS. 4A–4B, the light guide 100 is substantially "cone"-shaped and thus the second mirrored surface 122 is located substantially opposite the first mirrored surface 20. The relative angle degree between the second mirrored surface 122 and the first mirrored surface 120 is preferably a 90° angle. However, one skilled in the art will appreciate the mirrored surfaces 120 and 122 may be positioned at various angles within the light guide 108 and achieve a similar result. For example, FIGS. 5A-5B illustrate that the relative angle degree may be less than 90°.

Light paths L1 and L2 are shown in FIG. 4A to illustrate examples of the path the light ma travel from the LED 102, through the light guide 108, and eventually onto the CCD 106. For example, the light path L1 travels from the LED 102 into the light pipe 110. The light pipe 110 guides the light along light path L1 until the light strikes the first mirrored surface 20. The light path L1 reflects off the first mirrored surface 20 towards the second mirrored surface 122. The light path L2 reflects off of the second mirrored surface 122 towards the outlet 112. The light path L1 exits the light guide 108 and strikes the top surface of the wafer 111. The light path L2 follows a similar route as the light path L1. However, the light path L2 exits the light guide 108 and strikes the top surface of the CCD 106 instead of the wafer 111.

As shown in FIG. 4A, the light paths L1 and L2 exit the light guide along a path that is substantially perpendicular to the top surface of the CCD 106 and the wafer 111. The wafer 111 is preferably situated close to the CCD 106—shown as distance D in FIG. 4A. Minimizing the distance D between the bottom of the wafer 111 and the top surface of the CCD 106 improves the accuracy of the pre-aligner 100. Casting a shadow onto the CCD 106 is less precise the further the light has to travel. In a preferred embodiment, the wafer 111 is located in a rotating chuck (not shown) such that the wafer's edge 161 hangs over at least a portion of the top surface of the CCD 106 and is located below the output 112 of the light guide 108. When the wafer 111 interrupts the light exiting the light guide 108, it casts a shadow on the CCD 106. For example, the wafer 111 prevents the light path L1 from reaching the CCD 106 and thus casts a shadow on the CCD 106 at that location.

The outlet 112 of the light guide 108 includes a lens 109 (see FIG. 8) seated within the outlet 112. In one embodiment, the lens 109 has a convex surface that faces the wafer 111 and the CCD 106. The lens 109 converges the outgoing light (e.g., light paths L1, L2, and L3) exiting the outlet 112 of the light guide 108. Thus, the light exiting the light guide 108 (e.g., light paths L1, L2, and L3) travels along a path that is substantially perpendicular to the top surface of the wafer 111 and the top surface of the CCD 106.

FIGS. 5A–5B illustrate the light paths L1, L2, and L3 to further demonstrate how the pre-aligner 100 aligns a wafer 111. As shown in FIG. 5A, the light path L1 travels through the light pipe 110, strikes the first mirrored surface, reflects towards the second mirrored surface 122, and exits through the outlet 112 of the light guide 108. The light path L1 exits the outlet 112 along a substantially vertical path that strikes the CCD 106. The light path L2 travels through the light guide 108 in a similar fashion—exiting the light guide 108 and striking the CCD 106. The light path L2 travels close to the wafer edge 161 along the way to the CCS 106. L3 also travels through the light guide 108. However, the light path L2 exits the light guide 108 and strikes the top surface of the wafer 111.

If the wafer 111 is misaligned on the rotating chuck 150 (see FIG. 6) the wafer edge 161 will oscillate left and right (from the perspective of FIG. 5A) and occasionally interrupt the light path L2. When the wafer 111 is aligned on the rotating chuck 150 the wafer edge 161 will prevent a constant number of light paths from striking the CCD 106. In other words, a similar number of light paths will strike the CCD 106 while the wafer 111 is rotating. FIG. 5B illustrates that the light paths will repeatedly reflect as it travels up the light pipe 110.

Figure 6:
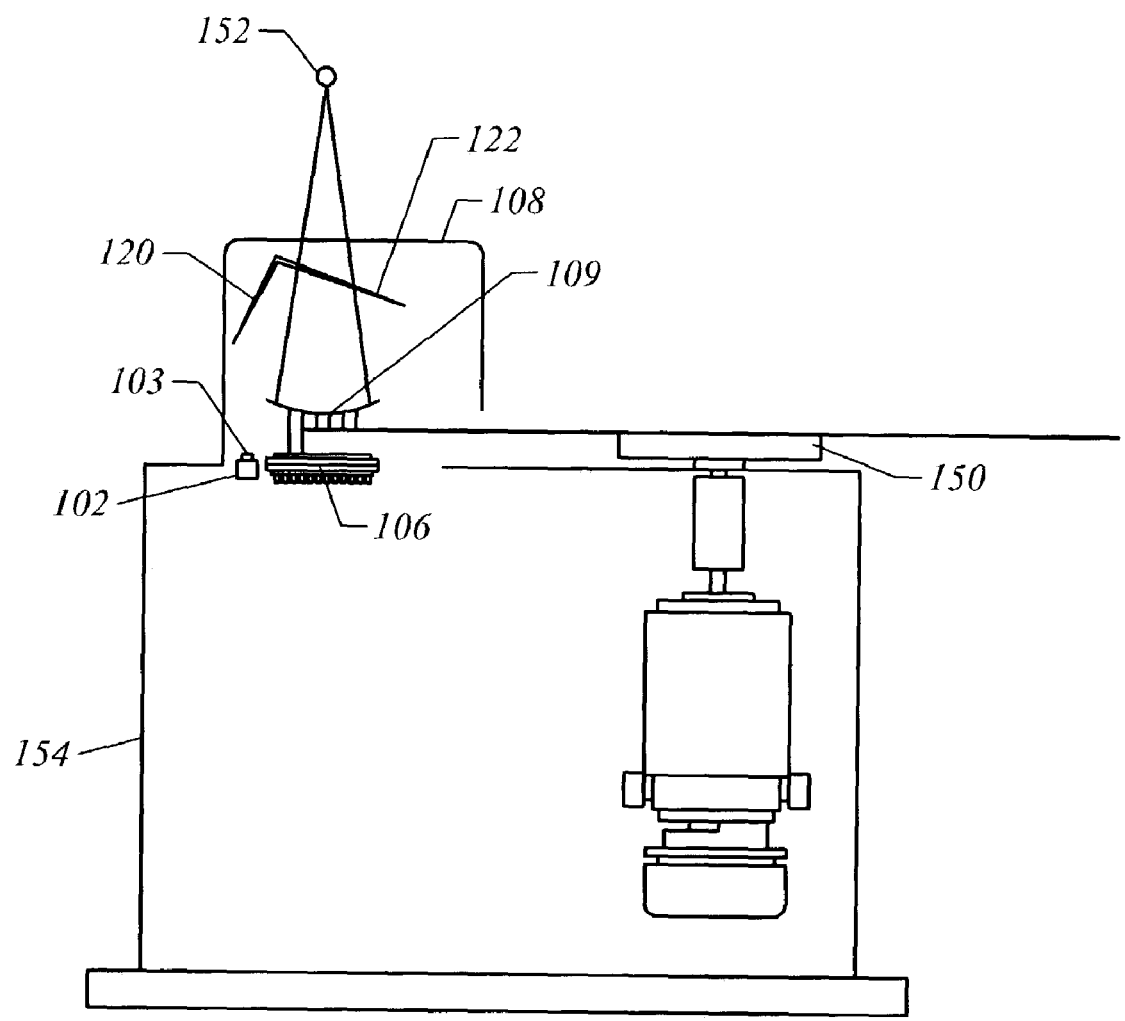
FIG. 6 is a representative drawing of an embodiment of the present invention.

FIG. 6 illustrates the space saving characteristics achieved by the present invention by placing the LED 102 and the CCD 106 adjacent to each other instead of opposite or facing each other. The wafer 111 is supported by the rotating chuck 150 in such a manner that the edge of the wafer 111 hangs over a portion of the CCD 106. The LED 102 is shown adjacent the CCD 106. The light-emitting portion 103 of the LED 102 does not directly or partially face the CCD 106. The light guide 108 directs the light emitted from the LED 102 onto the top surface of the wafer 111 and the top surface of the CCD 106. The lens 109 seated within the outlet 112 of the light guide 108 collimates the light exiting the light guide 108.

Figure 1:
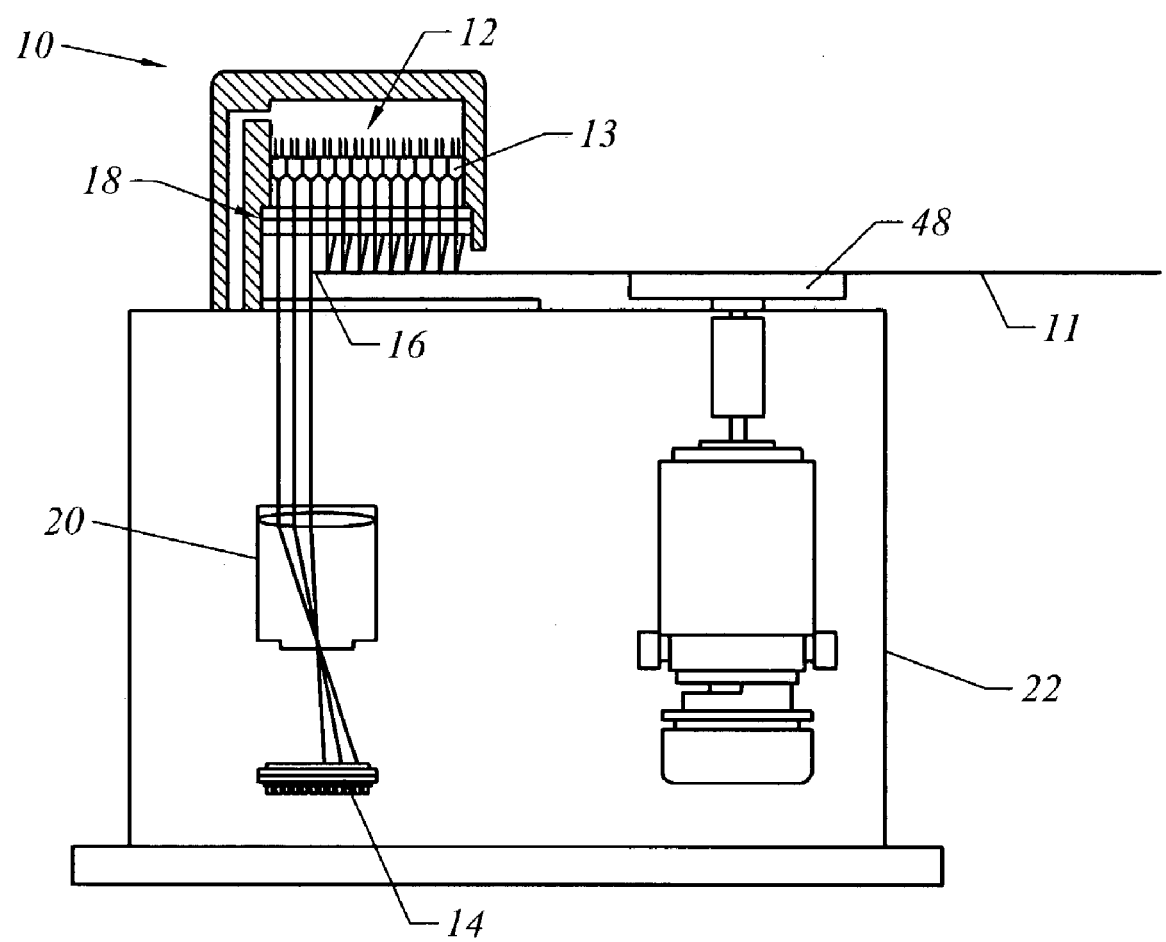
FIG. 1 is a representative drawing of an embodiment of a pre-aligner, according to the prior art.
Figure 2:
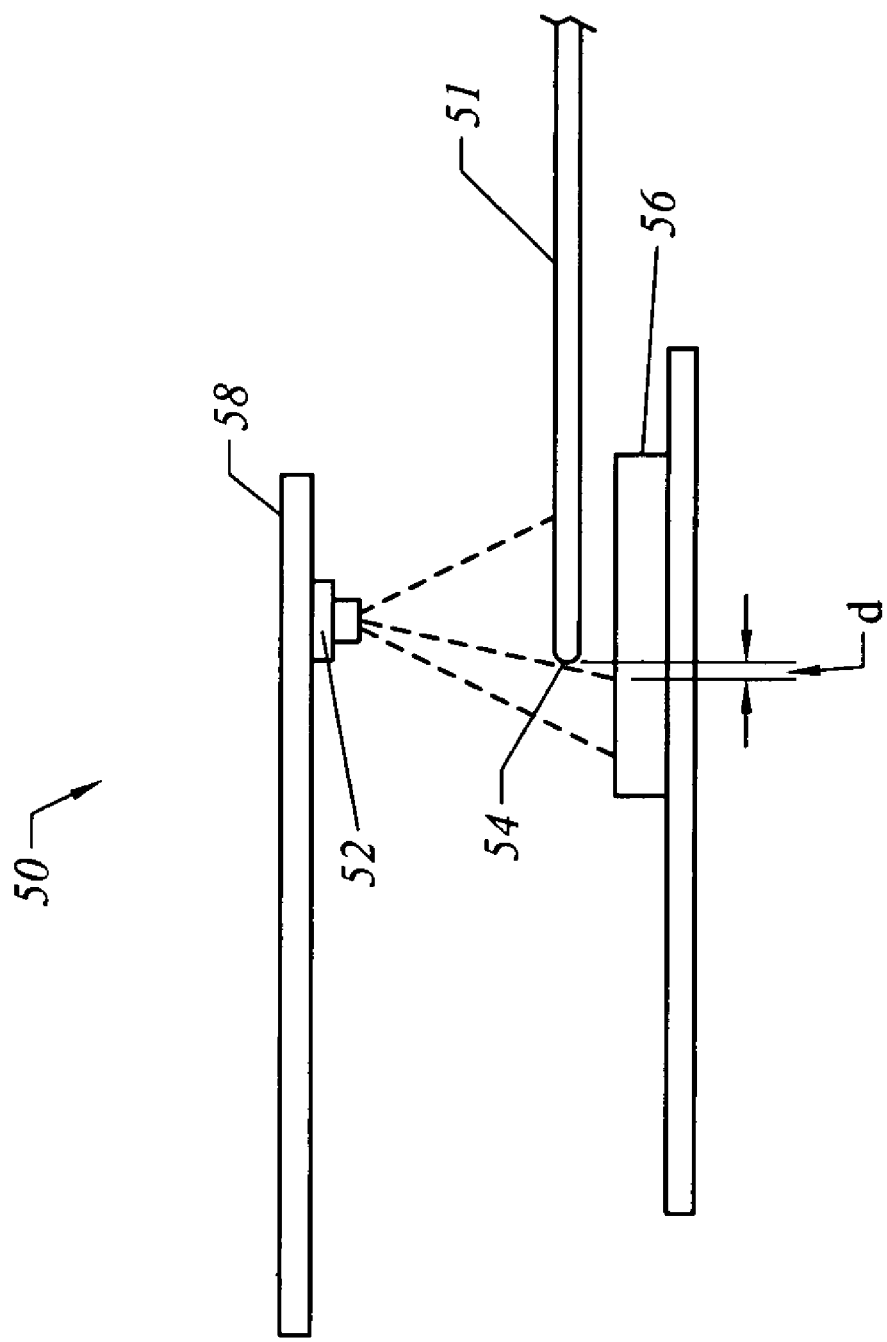
FIG. 2 is a representative drawing of another embodiment of a pre-aligner, according to the prior art.
Figure 3:
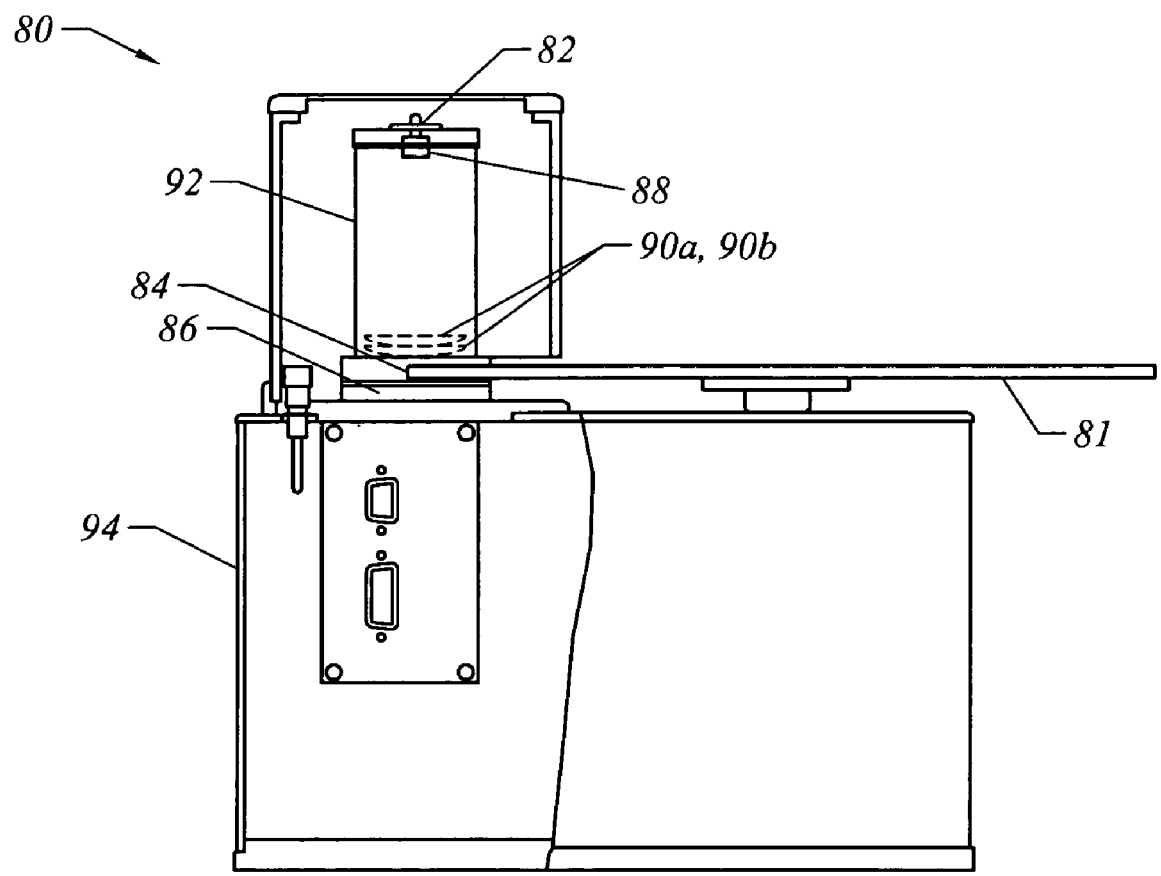
FIG. 3 is a representative drawing of still another embodiment of a pre-aligner, according to the prior art.

As previously discussed, conventional aligners (e.g., aligner 10 in FIG. 1) require the LED 102 to directly face the CCD 106 because the aligner requires a straight light path from the LED to the CCD. The apparent light source 152 shown in FIG. 6 illustrates where the LED 102 would be located in relation to the CCD 106 in a conventional aligner. The light guide 108 provides a more compact design than the housing 18 that encloses the LED's 13 in the conventional aligner 10. Further, the light guide 108 does not contain any electrical wiring, which is required in the housing 18 to power the LED's 13. In the present invention, substantially all of the electrical circuits for powering the LED 102 are contained within the PCB 104.

The light striking the CCD 106 is effectively from a small aperture source (e.g., LED 102) at a large distance. Thus, the shadow cast by the wafer 111 onto the CCD 106 is minimally dispersed along the line of the CCD's pixel array. The light diverging out of the LED 102 is initially constrained by the light pipe 110 and remains within the light guide 108 until the light passes through the exit window 112. At this point, the light resumes its original divergence. Thus, a single LED 102 is able to cast enough light on the CCD 106 to saturate it if need be.

The curvature of the lens 109 serves to refract the exiting light to a substantially vertical path prior to passing the wafer edge 161 or striking the CCD 106. This feature prevents vertical motion of the wafer edge 161 (vertical runout) causing radial motion of the wafer edge's shadow.

Because the light passing the wafer edge is substantially vertical, vertical runout of the spindle, which makes the wafer edge move up and down, does not move the shadow along the CCD 106 in response to this runout. Thus, measurements of the movement of the shadow are more accurate than many conventional pre-aligners. In addition, the vertical light path makes the shadow on the CCD 106 move exactly the same distance as the wafer edge. The light from the LED 102 is concentrated on the area of the CCD 106 that is not covered by the wafer. This allows an increased optical path length from the LED 102 to the CCD 106 resulting in a reduced spread of the shadow of the wafer edge on the CCD 106.

Figure 7:
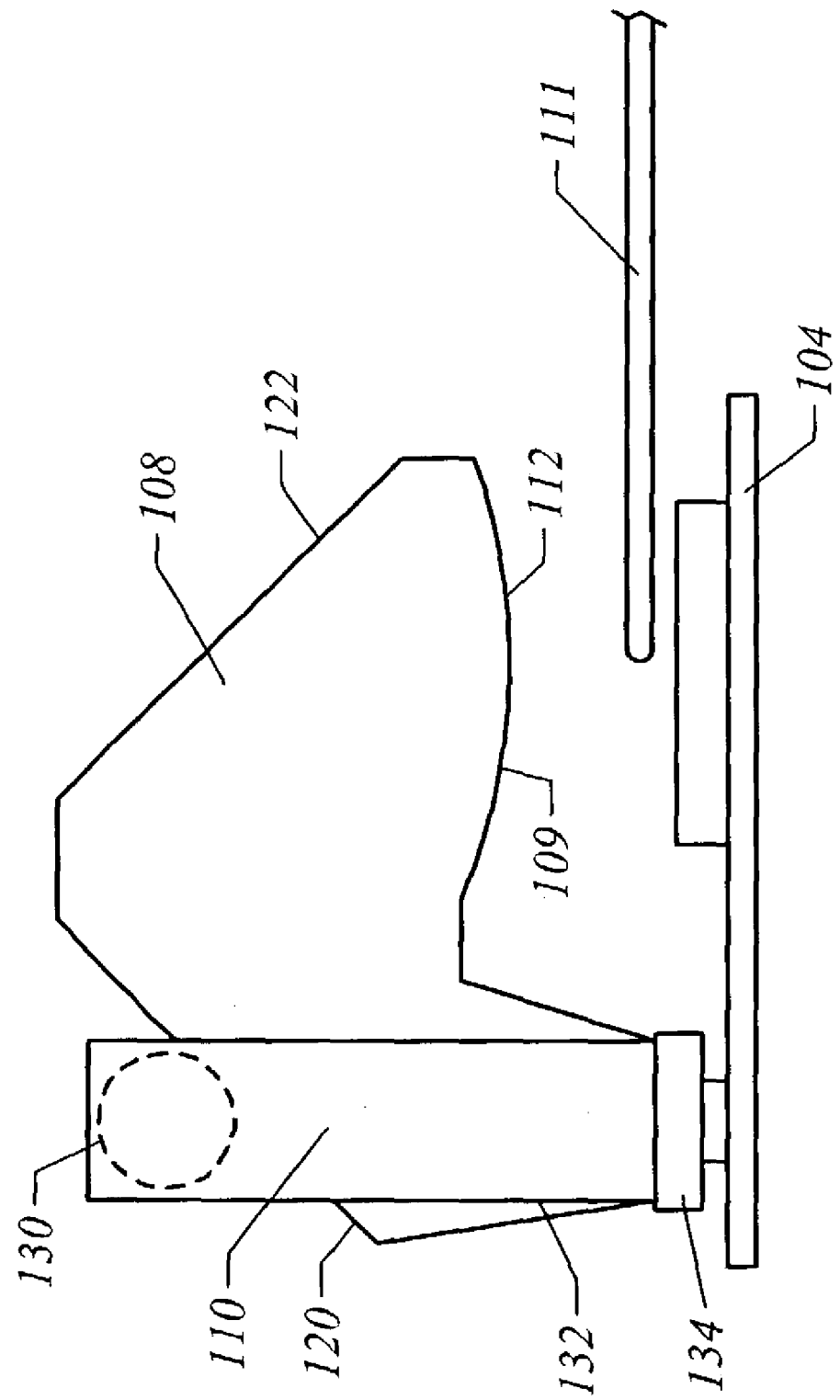
FIG. 7 is a representative drawing of another embodiment of the present invention.

FIG. 7 illustrates another embodiment of the pre-aligner 100. In this embodiment, the vent guide 108 is removably attached to the housing 154 (See FIG. 6). Specifically, the light pipe portion 110 is removably attached to a pair of steel pole pieces 132. A magnet 130, located between the two pole pieces 132, holds the poles 132 in place by magnetic attraction. In a preferred embodiment, the poles 132 are also mounted on an armature plate 134 and secured to the main body 154 of the pre-aligner 100.

Thus, the light guide 108 may be removed from the housing 154 without breaking any electrical connections. In other words, there are no electrical components within the light guide 108. Thus, the light guide 108 may be removably attached to the pre-aligner 100 housing 154 and can be detached from the housing 154 in response to any mishandling or robot collision. The light guide 108 may be reattached to the pre-aligner 100 housing 154 in the correct location with minimal effort.

The LED 102 must be calibrated to ensure that the pre-aligner 100 accurately centers the wafer 111. The calibration process must be performed with the wafer 111 absent so that the entire CCD 106 is illuminated by the light emitted by the LED 102. The LED current is preferably adjusted so that it is bright enough to put the CCD 106 output on the "light" side of the detection threshold over the whole CCD 106 length, within some reasonable margin. Calibrating the LED 102 also maximizes the LED life by minimizing its power consumption. Calibrating the LED 102 also ensures that the pre-aligner functions properly while the LED 102 ages and its intensity changes. Another reason to calibrate the LED 102 is to ensure the pre-aligner 100 works properly with the wide variation of initial LED intensities without human intervention in the factory.

The single LED 102 is capable of providing enough light to saturate the CCD 106. Electronics exist today, and are well known within the art, to set the current delivered to the LED 102. It is necessary to make the LED brightness sufficient to make the CCD output exceed the program light detection threshold, plus some margin. It is also necessary to avoid total saturation of the CCD 106. It is desirable to use a minimum amount of light so that stray light paths have minimal effect on the detection of the wafer's shadow edge. Thus, a calibration step is desirable in order to select an appropriate value for the LED current.

By way of example only, one embodiment of the calibration algorithm is as follows:

1. Set the CCD detection threshold to a lower level than is normally used. The specific value must be determined by consideration of the margin desired, i.e., the desired minimum voltage difference between the threshold and the illuminated level.
2. Reduce the LED current until the light to dark transition is detected. The radial location is unimportant.
3. Increase the LED current until no light to dark transition is detected. This is now the desired LED current for normal operation.
4. Restore the normal detection threshold.

Conventionally, the LED calibration function is performed during power up of the pre-aligner 100. However, if the pre-aligner 100 is left on continuously, the LED calibration function can be performed at some reasonable time intervals after power up, for instance, once each week. Alternately, the LED calibration function may be performed when instructed by a diagnostic command from either a local processor or a central, remotely processor.

In a preferred embodiment, there is no need for recalibration upon replacing guide 108 onto the pre-aligner 100. This feature may allow simpler, more compact packing for shipment, and better protects the pre-aligner 100 in shipping. It also reduces the chance of damage in case a robot crashes into the light guide 108.

The pre-aligner 100 may accommodate various sizes of wafers. To accommodate 200 mm and 300 mm wafer sizes, the light guide 108, LED 102, and CCD 106 may be moved as a single unit by repositioning the housing 154 to which they all mount.

It is common within the industry to isolate the LED 102 from the rest of the pre-aligner 100, and typically the LED 102 extends out from a surface, exposing it to damage. For example, operators can grab the light source or LED when they pick up the pre-aligner or a robot may strike the LED in error. If the LED is touched, it is likely that the LED will become damaged or require recalibration. In one embodiment of the present invention, the LED 102 detaches from the light pipe 110. This is accomplished by securing the LED 102 within the light pipe 110 by a magnetic force. As previously mentioned, the magnet 150 in combination with the two magnetic plates holds the LED 102 in position. In a preferred embodiment, dowel pin locating features are used in addition to the magnet 150 and the magnetic plates to ensure that the LED 102 is always in proper alignment when it is replaced back into the light pipe 110.

Although the invention has been described in detail herein, it should be understood that the invention is not limited to the embodiments herein disclosed. Various changes, substitutions and modifications may be made thereto by those skilled in the art without departing from the spirit or scope of the invention as described and defined herein.

The invention claimed is:

1. An aligner for aligning substantially flat workpieces having an edge, comprising:
   a light emitting diode;
   a sensor having a top surface that is capable of sensing light;

a chuck for rotating the workpiece substantially about the geometric center of the workpiece, said chuck supporting the workpiece such that the edge of the workpiece is suspended over said top surface of said sensor;

a light guide having an inlet and an outlet, said light guide including a plurality of internal reflective surfaces, each one of said plurality of internal reflective surfaces for directing light emitted into said inlet by said light emitting diode towards said outlet; and a collimating lens seated within said outlet; and wherein said light emitting diode is not housed within said light guide.

2. The aligner according to claim 1, wherein said light emitting diode is located substantially beneath said inlet of said light guide device.

3. The aligner according to claim 2, wherein said light emitting diode emits light upward into said inlet.

4. The aligner according to claim 1, wherein said sensor comprises a charge coupled device.

5. The aligner according to claim 1, wherein a workpiece seated on said chuck casts a shadow on said sensor when said light emitting diode is emitting light into said light guide.

6. The aligner according to claim 1, wherein said lens comprises a convex lens.

7. The aligner according to claim 1, wherein said plurality of reflective surfaces comprise mirrored surfaces.

8. The aligner according to claim 1, further comprising a printed circuit board.

9. The aligner according to claim 8, wherein said light emitting diode and said sensor are mounted on said printed circuit board.

10. An apparatus for aligning a wafer, comprising:
  a light emitting diode;
  a sensor having a top surface that is capable of sensing light;
  a chuck for rotating the wafer substantially about the wafer's geometric center, said chuck supports the wafer such that the wafer is suspended over a portion of said top surface of said sensor; and
  a light guide having an inlet and an outlet, said light guide including:
    a plurality of reflective surfaces, each one of said plurality of reflective surfaces for reflecting light emitted into said light guide by said light emitting diode towards said outlet;
  means for collimating light passing through said outlet; and
  wherein said light emitting diode does not emit light directly towards said sensor.

11. An aligner for aligning substantially flat workpieces having an edge, comprising:
  a light guide having an inlet and an outlet;
  a light emitting diode located beneath said inlet of said light guide;
  a sensor having a top surface that is capable of sensing light;
  a chuck for rotating the wafer substantially about the wafer's geometric center and suspending a portion of the wafer over said top surface of said sensor;
  said light guide including a plurality of internal reflective surfaces, each one of said plurality of internal reflective surfaces reflecting light emitted into said inlet by said light emitting diode and redirecting the light towards said outlet; and
  a collimating lens seated within said outlet.

12. The aligner according to claim 11, wherein a workpiece seated on said rotating chuck casts a shadow on said sensor when said light emitting diode is emitting light into said light guide.

13. The aligner according to claim 11, wherein said collimating lens comprises a convex lens.

14. The aligner according to claim 11, wherein said plurality of internal reflective surfaces each comprise a mirrored surface.

15. The aligner according to claim 11, further comprising a printed circuit board.

16. The aligner according to claim 15, wherein said light emitting diode and said sensor are mounted on said printed circuit board.

* * * * *